(12) United States Patent
Dabral et al.

(10) Patent No.: US 6,192,431 B1
(45) Date of Patent: Feb. 20, 2001

(54) METHOD AND APPARATUS FOR CONFIGURING THE PINOUT OF AN INTEGRATED CIRCUIT

(75) Inventors: Sanjay Dabral, Milpitas; Dilip K. Sampath; Christopher Cheng, both of Sunnyvale, all of CA (US)

(73) Assignee: Intel Corporation, Santa Clara, CA (US)

(*) Notice: Under 35 U.S.C. 154(b), the term of this patent shall be extended for 0 days.

(21) Appl. No.: 09/001,550

(22) Filed: Dec. 31, 1997

(51) Int. Cl.[7] .................................................. G06F 10/00

(52) U.S. Cl. .................................................. 710/62; 710/8

(58) Field of Search .................................................. 710/8, 62–74

(56) References Cited

U.S. PATENT DOCUMENTS

| | | | |
|---|---|---|---|
| 5,701,517 | * 12/1997 | Carpenter | 710/66 |
| 5,715,197 | * 2/1998 | Nance et al. | 365/189.02 |
| 5,737,764 | * 4/1998 | Shigeeda | 711/170 |
| 5,748,982 | * 5/1998 | Smith et al. | 710/9 |
| 5,822,610 | * 10/1998 | Fung et al. | 395/800.39 |
| 5,835,965 | * 11/1998 | Taylor et al. | 711/211 |

\* cited by examiner

*Primary Examiner*—David A. Wiley
(74) *Attorney, Agent, or Firm*—David J. Kaplan

(57) ABSTRACT

A method and apparatus for configuring the pinout of an integrated circuit. An integrated circuit includes an input/output structure including an input/output port. The input/output structure communicates a first signal in a first configuration and a second signal in a second configuration. The first and second signals are parallel signals of a bus.

16 Claims, 6 Drawing Sheets

METHOD AND APPARATUS FOR CONFIGURING THE PINOUT OF AN INTEGRATED CIRCUIT

FIELD OF THE INVENTION

The present invention relates to computer systems and more particularly to selecting pinout configurations of a bus in an integrated circuit.

BACKGROUND OF THE INVENTION

A typical computer system, such as a personal computer, mobile computer, or personal data assistant, includes several integrated circuits (ICs) that are electrically connected to each other on a printed circuit board (PCB). The ICs communicate with each other via their input/output (IO) ports. The IO ports of one IC are electrically connected to the IO ports of another IC by electrical interconnects formed on the PCB.

To meet consumers' demands for faster computer systems, the speed of communication between ICs on a PCB must increase. One way to increase this communication speed is to move the ICs closer together on the PCB and to shorten the lengths of the electrical interconnects that connect the IO ports of the ICs together. Shortening the electrical interconnects has the effect of not only increasing the speed and reliability of communication between ICs but also reducing the size of the PCB, allowing faster and more compact computer systems to be manufactured. In addition, power consumption is reduced because less power is required to drive the communication signals over a shorter distance between ICs.

The pinout of an IC defines which IO port of the IC is connected to which signal line within the IC. An IO port is an electrical contact of a first IC that is designed to be electrically connected to a second IC for communication (either sending information, receiving information, or both). For an unpackaged IC formed on a semiconductor substrate, an IO port is typically a metal pad. Once packaged, this IO port is typically electrically connected to another IO port on the package such as another metal pad, a metal pin, a solder ball, or other electrical connector. As used herein, ICs and packaged ICs are both referred to as ICs.

One barrier to shortening the electrical interconnects between ICs on a PCB is the pinout configuration of the ICs. If the pinout of an IC is such that an IO port on one side of an IC is to be connected to an IO port on an opposite side of an adjacent IC, the interconnect between the two IO ports must be routed a relatively long distance across the PCB. The length of this interconnect will reduce the speed of communication signals sent across the interconnect between the two IO ports. In addition, this relatively long interconnect complicates the routing of other interconnects that must be routed around it.

One solution is to rotate one of the ICs on the PCB by 180 degrees so that the IO ports that are electrically connected to each other are closer together. Unfortunately, this may complicate the coupling of other IO ports between the two ICs, causing excessive cross-routing of the other interconnects. In addition, rotating one IC with respect to another causes skew problems with signals communicated between the ICs. This is particularly true for parallel signals of a bus. The different interconnect lengths that communicate different bit signals of the bus between the two ICs cause the signals to be communicated at different speeds.

Another solution is to place one IC on top of the PCB and the other IC on the bottom of the PCB directly underneath the first IC. This way the interconnect lengths that connect IO ports on the upper IC to IO ports on the lower IC can be significantly reduced by simply routing the interconnects through the relatively thin PCB. Unfortunately, the same interconnect cross-routing problems are encountered.

For example, assume the upper IC is identical to the lower IC. Once the lower IC is flipped upside-down to be connected to the underside of the PCB, its pinout will no longer be aligned to the pinout of the upper IC. As a result, the interconnects between the two ICs will be unequal in length, leading to skew problems.

SUMMARY OF THE INVENTION

A method and apparatus for configuring the pinout of an integrated circuit is described. An integrated circuit includes an input/output structure including an input/output port. The input/output structure communicates a first signal in a first configuration and a second signal in a second configuration. The first and second signals are parallel signals of a bus.

Other features and advantages of the present invention will be apparent from the accompanying drawings and the detailed description that follows.

BRIEF DESCRIPTION OF THE DRAWINGS

The present invention is illustrated by way of example and not limitation in the figures of the accompanying drawings in which like references indicate similar elements and in which.

DETAILED DESCRIPTION

A method and apparatus for configuring the pinout of an integrated circuit (IC) is described. For an electronic component formed in accordance with one embodiment of the present invention, two identical ICs are connected to a printed circuit board (PCB). The two ICs include configuration input/output (IO) ports that control the pinout configuration of the ICs.

The configuration IO port of the first IC is connected to a power plane of the PCB. The configuration IO port of the second IC is connected to a ground plane of the PCB. The configuration IO port of each IC is connected to a configuration signal line within the IC. The configuration signal line is connected to the control inputs of multiplexers that select the pinout configuration of the IC. Coupling the configuration IO port of the first IC to the power plane places the first IC in a first pinout configuration, and coupling the configuration IO port of the second IC to the ground plane places the second IC in a second pinout configuration.

The first and second pinout configurations are such that the second pinout configuration is a mirror image of at least a portion of the first pinout configuration. In this manner, one IC can be connected to the PCB directly beneath the other IC, and the IO ports that comprise the portion of their pinouts that are mirror images of each other can be directly connected to one another by interconnects straight through the PCB (e.g. through-hole interconnects). This reduces the length of these interconnects in comparison to prior art interconnect routings without mirrored pins. As a result, the communication signal speed and integrity is improved between the ICs, and power consumption is reduced, particularly for complementary metal-oxide-semiconductor (CMOS) ICs.

For one embodiment of the present invention, the portion of the first pinout configuration that is mirrored by the second pinout configuration corresponds to an address or data parallel signal bus that is shared between the two ICs. For this embodiment, the ICs may be memory devices or processors in a multiprocessor computer system. A more detailed description of embodiments of the present invention, including various configurations and implementations, is provided below.

Figure 1A:
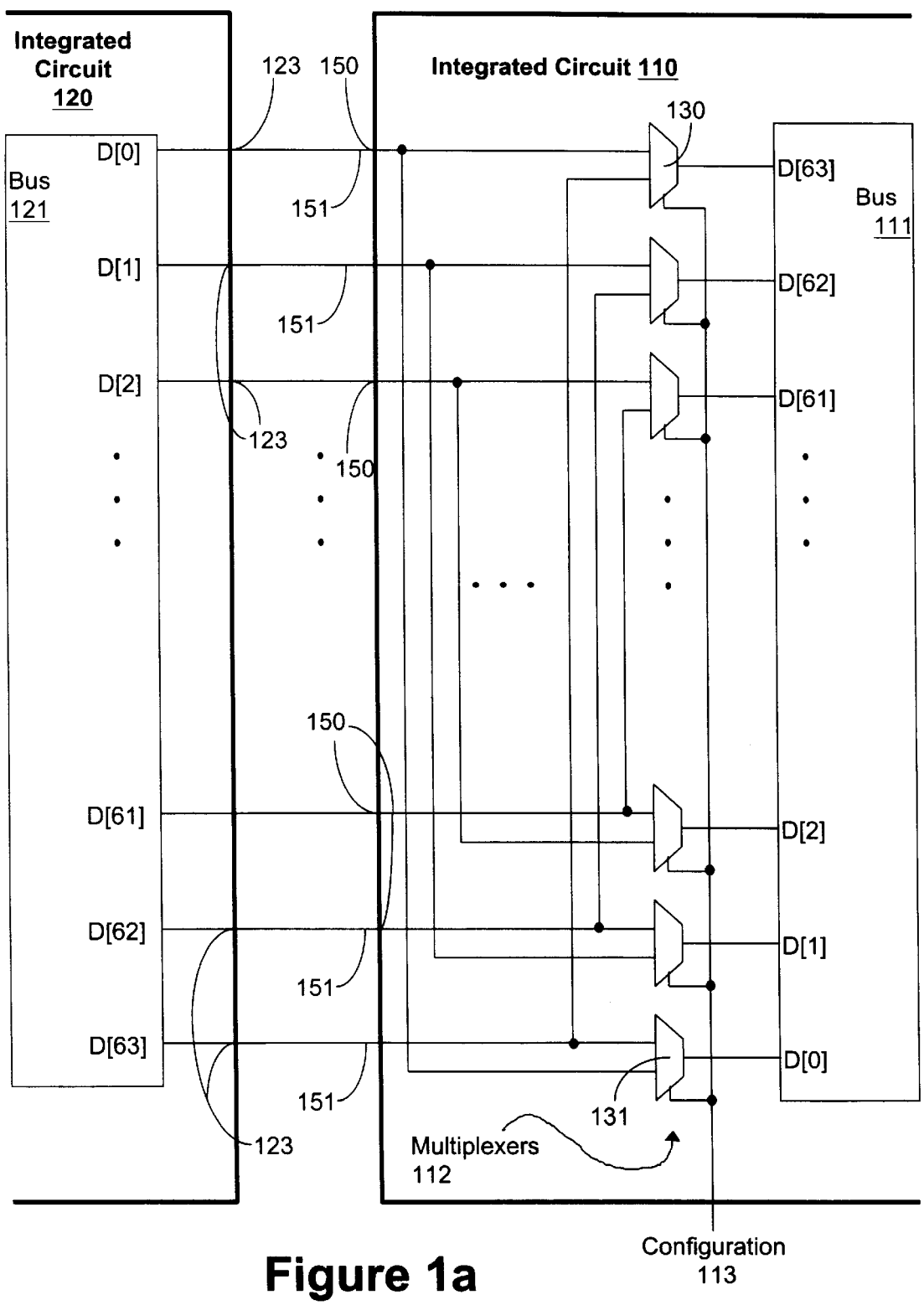
FIG. 1*a* is an electronic component formed in accordance with an embodiment of the present invention in a first configuration.

FIG. 1a is an electronic component formed in accordance with an embodiment of the present invention in a first configuration. IC 120 includes a 64 bit parallel signal bus 121 having a least significant bit position labeled D[0] and a most significant bit position labeled D[63]. Each bit position of bus 121, D[0], D[1], D[2], . . . D[61], D[62], and D[63], communicates a parallel signal of the bus corresponding to its bit position. Each signal from each bit position of bus 121 is sent through through an IO port 123 of IC 120, across an interconnect 151 formed on a PCB, and into a corresponding IO port 150 of IC 110. Once inside IC 110, each of the parallel signals from bus 121 are split and sent to two multiplexers of the set of multiplexers 112. The control input to each of multiplexers 112 is connected to a configuration signal line that is connected to configuration IO port 113. The output of each of multiplexers 112 is connected to a corresponding bit position of 64 bit parallel bus 111, denoted D[63], D[62], D[61], . . . D[2], D[1], and D[0]. Note that in accordance with one embodiment of the present invention, the ICs of FIG. 1a additionally include driver and receiver circuits corresponding to each IO port of the ICs.

Each of IO ports 150 of IC 110 of FIG. 1a are selectively connected to one of two bit positions of bus 111 according to the signal applied at configuration IO port 113. For example, the signal in the least significant bit (LSB) position of bus 121, D[0], is split in IC 110 and applied to an input of each of two multiplexers 130 and 131. The signal in the most significant bit (MSB) position of bus 121, D[63], is split in IC 110 and applied to the other inputs of each of the two multiplexers 130 and 131. The output of multiplexer 130 is connected to the signal line of bus 111 that communicates the MSB position of bus 111, D[63]. The output of multiplexer 131 is connected to the signal line of bus 111 that communicates the LSB position of bus 111, D[0].

A bias is applied to configuration IO port 113 to select the lower inputs to multiplexers 112 of FIG. 1a. As a result, the lower input to multiplexer 130, D[63] is connected to the signal line in the MSB position of bus 111, D[63], and the lower input to multiplexer 131, D[0], is connected to the signal line in the LSB position of bus 111, D[0]. In this manner, the pinout of IC 110 is matched to the pinout of IC 120 so that bus 121 communicates properly with bus 111. Other bit positions of bus 121 are connected to corresponding bit positions of bus 111 via multiplexers 112 in the same manner.

For one embodiment of the present invention, bus 121 and bus 111 are shared data buses. For another embodiment, buses 121 and 111 are shared address buses. ICs 120 and 110 may both be processors in a multiprocessor computer system, or they may be memory devices, in, for example, the cache of a computer system. For one embodiment, IC 120 is identical to IC 110. For an alternate embodiment, the ICs are different. As used herein, the term "identical" is meant to indicate the same make and model of a particular device. For example, two 300 MHz Pentium® II processors from Intel Corporation of Santa Clara, Calif. are considered to be "identical" to each other.

The bias applied to configuration IO port 113 of FIG. 1a, in accordance with one embodiment of the present invention, is either power (e.g. Vcc or Vss of the IC, "high", or a logical "1") or ground (e.g. Vdd of the IC, "low", 0 volts, or a logical "0"). This bias is applied to configuration IO port 113 by coupling the port to an interconnect that is connected to either power or ground of a power supply that supplies power to the electronic component. For one embodiment, the PCB to which ICs 110 and 120 are connected includes at least one power and one ground plane that distributes power and ground throughout the PCB. Configuration IO port 113 may be connected to either the power or ground plane to select the proper pinout configuration of IC 110.

Figure 1B:
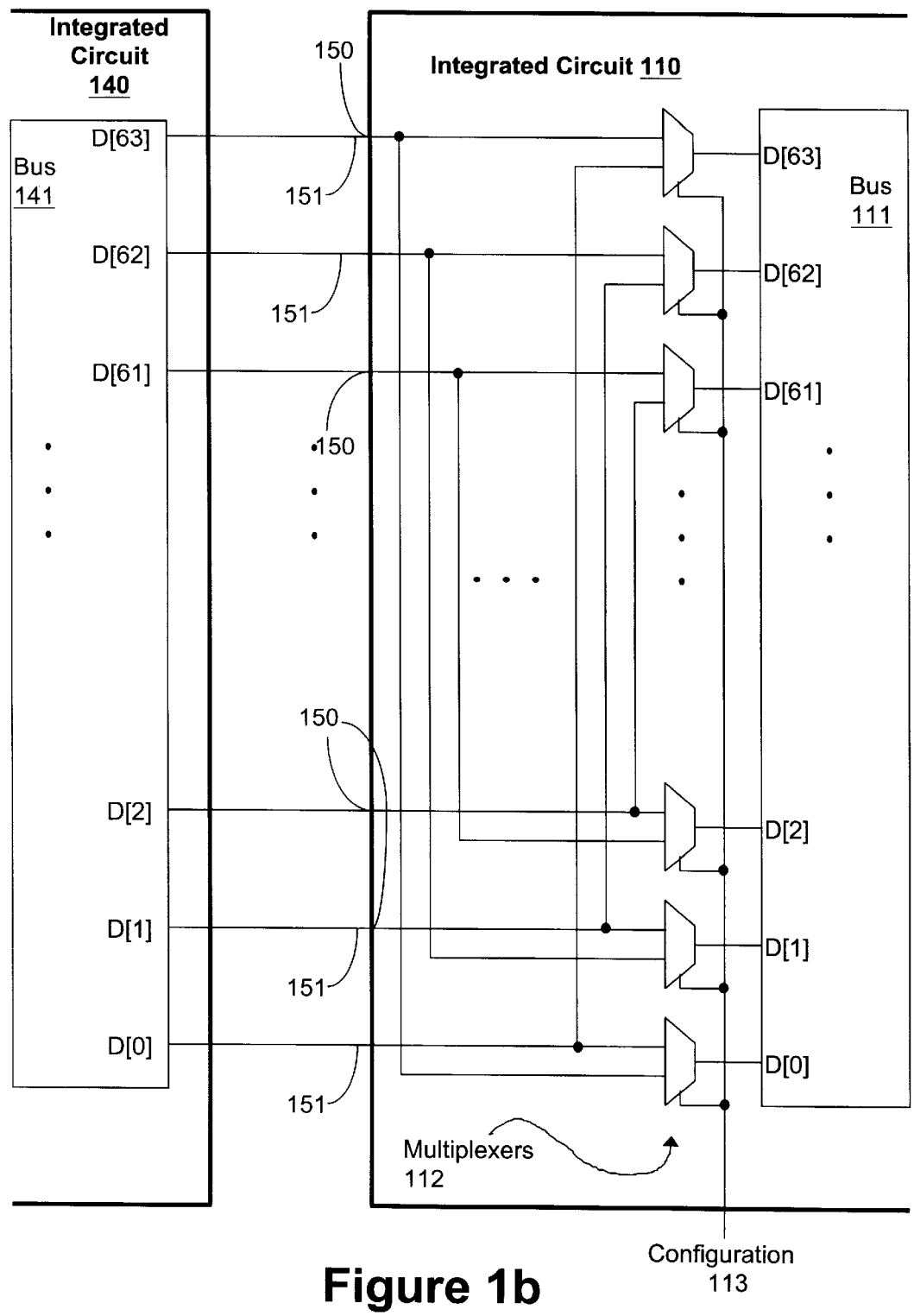
FIG. 1*b* is the electronic component of FIG. 1*a* in a second configuration.

FIG. 1b is the electronic component of FIG. 1a in a second configuration in which configuration IO port 113 of IC 110 is oppositely biased. For this embodiment, the configuration signal line selects the upper inputs to multiplexers 112 so that the IO ports 150 of IC 110 are connected to signal lines in different bit positions of bus 111, changing the pinout of the IC. This pinout configuration is selected to accommodate IC 140 having a parallel signal bus 141 with bit positions inverted in comparison to the bit positions of bus 121 of IC 120 of FIG. 1a. Depending on whether IC 120 or IC 140 is driving the bus connected to IC 110, the pinout of bus 111 of IC 110 is configured to align its IO ports 150 with the corresponding IO ports of either IC 120 or IC 140.

In this manner, interconnects 151 of FIGS. 1a and 1b between the two ICs do not need to be cross-routed to align the bit positions of the buses of IC 120 and 140 to the bit positions of bus 111 of IC 110. For one embodiment of the present invention, IC 120 of FIG. 1a is the same IC as IC 140 of FIG. 1b, oriented in a different direction. According to one embodiment of the present invention interconnects 151 are made as short as possible by orienting the ICs in a manner that will provide a more compact electronic component. For example, for one embodiment, the ICs are oriented side-by-side with IC 110 configured with the appropriate pinout to communicate signals of corresponding bit positions of bus 111 with adjacent IO ports of the other IC via PCB interconnects 151. For another embodiment, one IC is place on top of the PCB, and the other IC is placed below the PCB, with interconnects 151 coupling vertically-aligned IO ports through the PCB.

Generally, reducing the length of interconnects 151 of FIGS. 1a and 1b improves the bus signal integrity between the two ICs, resulting in more reliable communication. In addition, the shorter interconnects 151 provide for increased communication speed and lower power consumption, particularly for CMOS devices.

In accordance with one embodiment of the present invention, any additional delay associated with routing the bus signals through multiplexers 112 of FIGS. 1a and 1b, between IO ports 150 and bus 111, is insignificant in comparison to the increased speed associated with shortening interconnects 151. Note that the PCB interconnects between the ICs of FIGS. 1a, 1b, 2a, and 2b are not shown to scale and are actually much longer than indicated.

For an alternate embodiment of the present invention, the pinout configuration of an IC is selected by multiplexer control signals generated inside the IC rather than via an external configuration IO port. For example, for one embodiment, the IC is programmed to send a particular configuration control signal to the multiplexers. This programming may be done by the manufacturer of the electronic component once the manufacturer knows which pinout configuration is desired for a particular IC. Alternatively, the configuration selection programming may be done each time a computer system is turned on by, for example, coding the pinout selection into the basic input/output system (BIOS) code.

In accordance with an alternate embodiment of the present invention, some or all of multiplexers 112 of IC 110 of FIGS. 1a and 1b have more than two inputs to allow for more than two different pinouts of IC 110. For this embodiment, configuration IO port 113 includes two or more IO ports for selecting one of three or more different pinouts. This arrangement may be required to support multiple topologies using identical ICs.

For another embodiment of the present invention, the IC includes a set of multiplexers having outputs connected to the IO ports of the IC and inputs connected to the signal lines of the IC's internal bus. This embodiment is useful for configuring the pinout of the bus output signals, as described in more detail below. For one embodiment, an IC includes both input and output multiplexers for selecting the input and output pinout configuration of the bus, allowing for improved flexibility in comparison to an IC having only input or only output multiplexers.

Figure 2A:
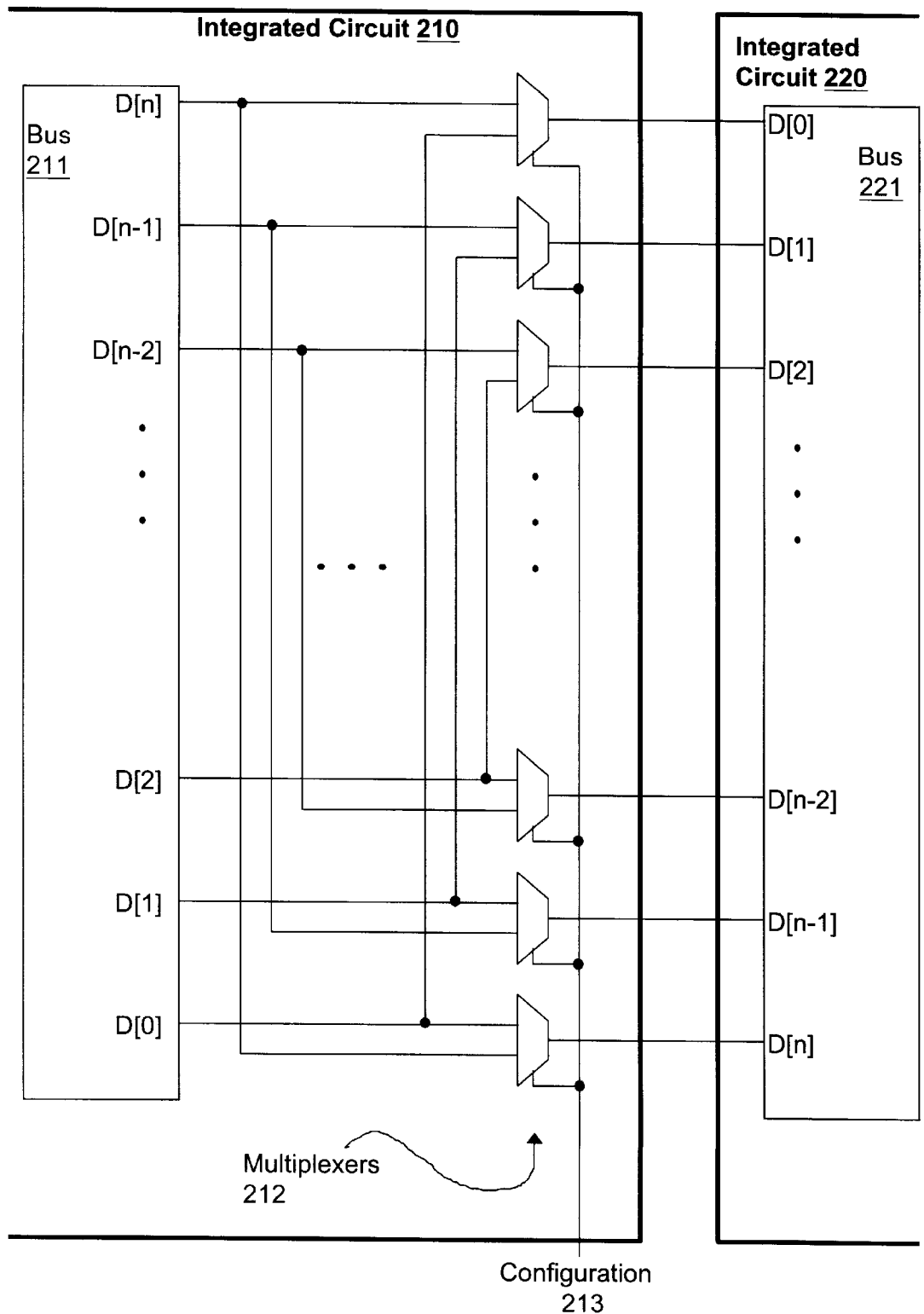
FIG. 2*a* is an electronic component formed in accordance with an embodiment of the present invention in a first configuration.

FIG. 2a is an electronic component formed in accordance with an embodiment of the present invention in a first configuration. IC 210 includes a parallel signal bus 211 having a least significant bit position, labeled D[0], and a most significant bit position, labeled D[n]. Each bit position of bus 211, D[n], D[n−1], D[n−2], . . . D[2], D[1], and D[0], communicates a parallel signal of the bus corresponding to its bit position. Each signal from each bit position of bus 211 is split and sent to the inputs of two multiplexers of the set of multiplexers 212. The control input to each of multiplexers 212 is connected to a configuration signal line that is connected to configuration IO port 213. The output of each of multiplexers 212 is sent through an IO port of IC 210, across an interconnect formed on a PCB, and into a corresponding IO port of IC 220. Each of the parallel signals from bus 211 are then connected to a corresponding bit position of bus 221 within IC 220, denoted D[0], D[1], D[2], . . . D[n−2], D[n−1], and D[n]. Note that in accordance with one embodiment of the present invention, the ICs of FIG. 2a additionally include driver and receiver circuits corresponding to each IO port of the ICs.

The selective coupling of the signal lines of bus 211 of FIG. 2a to the IO ports of IC 210 provides for an adjustable pinout of bus 211 and operates in a similar manner as described above with respect to FIG. 1a. The IO ports of IC 210 are selectively connected to one of two bit positions of bus 211 according to a signal, power or ground, applied to configuration IO port 213. A bias is applied to configuration IO port 213 to select the lower inputs to multiplexers 212. As a result, the pinout of IC 210 is matched to IC 220 so that bus 211 communicates properly with bus 221, forming a shared bus, without it being necessary to cross-route the interconnects that connect the IO ports of IC 210 to the IO ports of IC 220. For one embodiment of the present invention, IC 210 and IC 220 are located on opposite sides of a PCB and are vertically aligned, and the interconnects that connect the IO ports of IC 210 to the IO ports of IC 220 are formed through the PCB. For an alternate embodiment, IC 210 and IC 220 are located side-by-side on the same side of a PCB. According to one embodiment of the present invention, the interconnects that connect the two ICs together are made as short as possible by orienting the ICs in a manner that will provide a more compact electronic component.

Figure 2B:
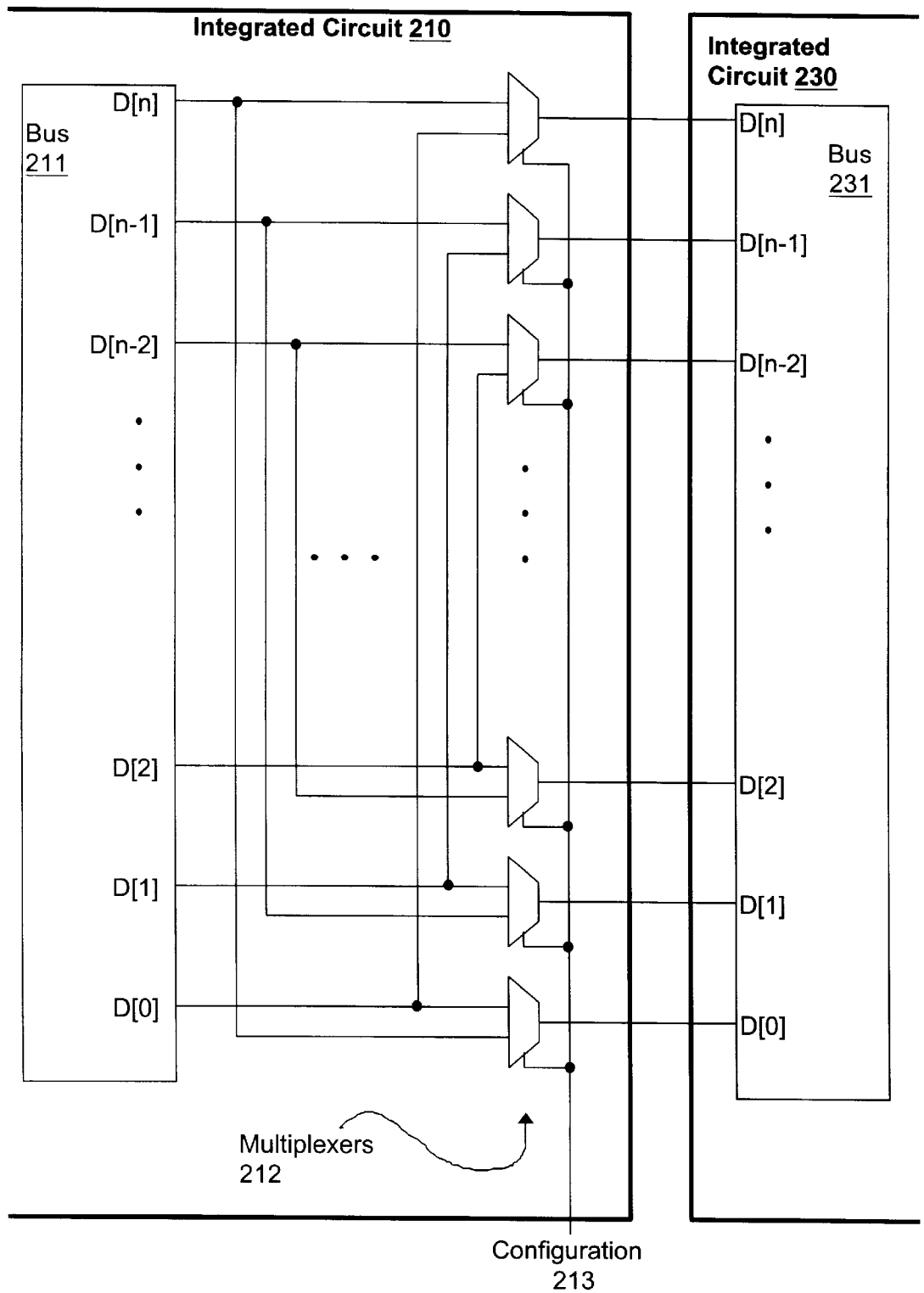
FIG. 2*b* is the electronic component of FIG. 2*a* in a second configuration.

FIG. 2b is the electronic component of FIG. 2a in a second configuration in which configuration IO port 213 of IC 210 is oppositely biased. For this embodiment, the configuration signal line selects the upper inputs to multiplexers 212 so that the IO ports of IC 210 are connected to signal lines in different bit positions of bus 211, changing the pinout of the IC. This pinout configuration is selected to accommodate IC 230 having a parallel signal bus 231 with bit positions inverted in comparison to the bit positions of bus 221 of FIG. 2a. Depending on whether IC 220 or IC 230 is driving the bus connected to IC 210, the bus pinout of IC 210 is configured to align its IO ports with the corresponding IO ports of either IC 220 or IC 230. For one embodiment of the present invention, IC 220 of FIG. 2a is the same IC as IC 230 of FIG. 2b, oriented in a different direction.

The selective coupling of the signal lines of bus 211 of FIG. 2b to the IO ports of IC 210, to provide for an adjustable pinout of bus 211, operates in a similar manner as described above with respect to FIG. 1b. The pinout of IC 210 is matched to IC 230 so that bus 211 communicates properly with bus 231 without it being necessary to cross-route the interconnects that connect the IO ports of IC 210 to the IO ports of IC 220. For one embodiment of the present invention, IC 210 and IC 230 are located on opposite sides of a PCB and are vertically aligned, and the interconnects that connect the IO ports of IC 210 to the IO ports of IC 230 are formed through the PCB. For an alternate embodiment, IC 210 and IC 230 are located side-by-side on the same side of a PCB. According to one embodiment of the present invention, the interconnects that connect the two ICs together are made as short as possible by orienting the ICs in a manner that will provide a more compact electronic component.

Figure 3:
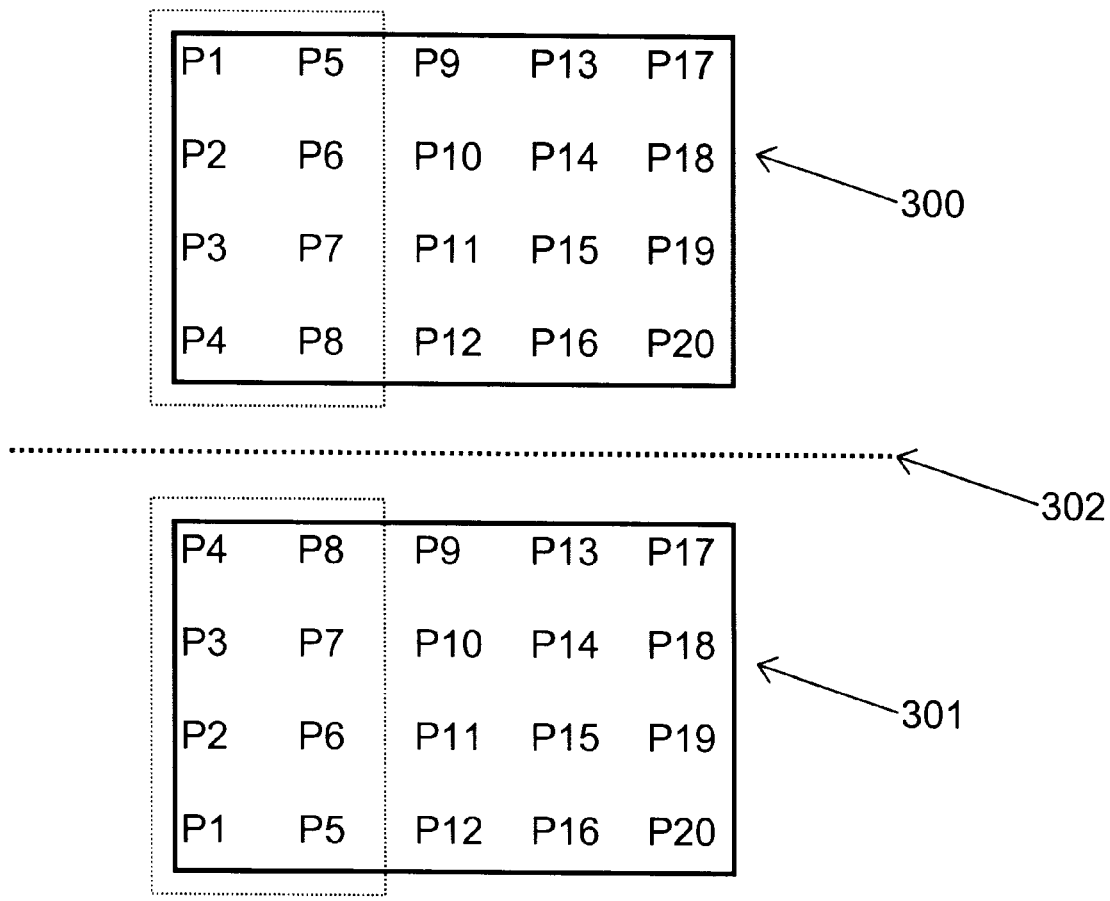
FIG. 3 is two ICs having different pinouts in accordance with an embodiment of the present invention.

FIG. 3 is two ICs having different pinouts in accordance with an embodiment of the present invention in which IC 300 and IC 301 are connected to opposite sides of a PCB and vertically aligned. To conceptualize the ICs connected to opposite sides of a PCB and vertically aligned, picture FIG. 3 folded along dotted line 302 with a PCB inserted into the fold. ICs 300 and 301 each have 20 IO ports comprising pins labeled P1 through P20. Pins P1 through P8 are each connected to different bit positions of a parallel signal bus within the two ICs. These buses are connected to each other through the PCB to form a shared bus between the two ICs. P1 communicates the first bit position of the bus; P2 communicates the second bit position of the bus; P3 communicates the third bit position of the bus, and so forth.

IC 300 is in a first configuration and IC 301 is in a second configuration such that the pinout of the bus of IC 301, pins P1 through P8, is a mirror image of the pinout of the bus of IC 300. In this manner, the IO ports of IC 301 are aligned to the IO ports of IC 300 such that adjacent pins above and below the PCB communicate the same bit positions of the bus. This allows the interconnects that connect pins P1 through P8 of IC 300 to the same pins of IC 301 to be made as short as possible, essentially reducing the interconnect length to the thickness of the PCB. As a result, the speed and integrity of the bus signals between IC 300 and IC 301 are improved.

Figure 4A:
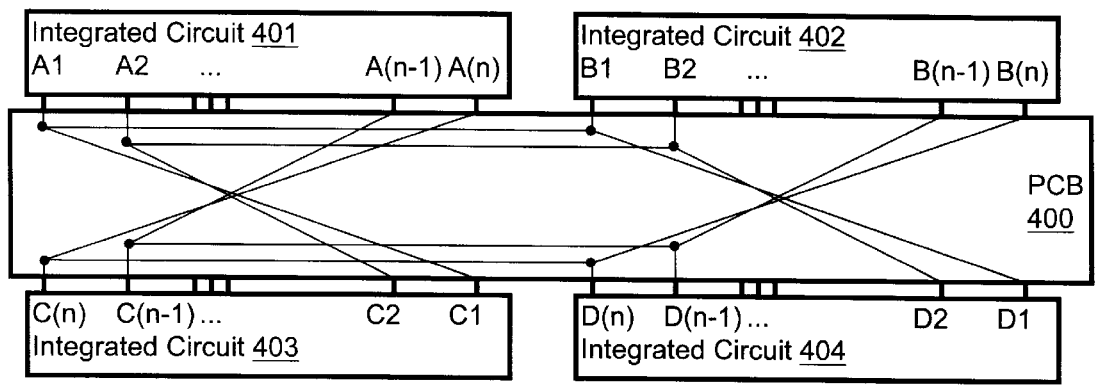
FIG. 4*a* is an electronic component formed in accordance with an embodiment of the present invention in a first configuration.
Figure 4B:
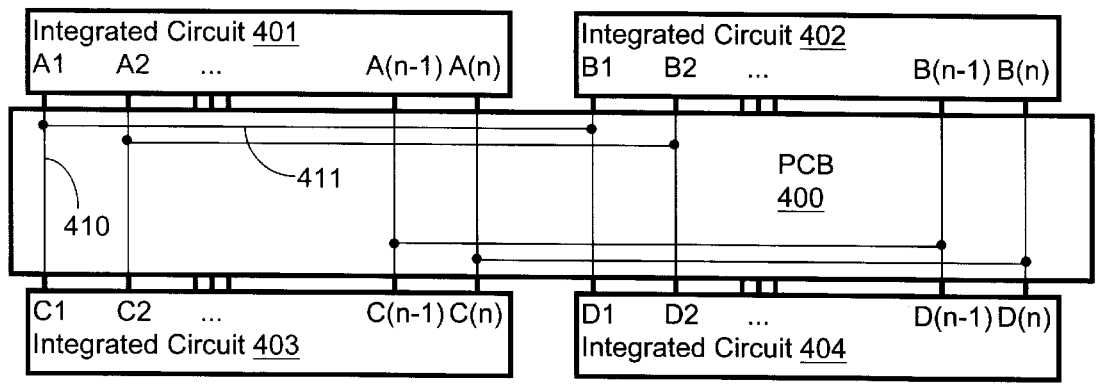
FIG. 4*b* is the electronic component of FIG. 4*a* in a second configuration.

FIGS. 4*a* and 4*b* are an electronic component formed in accordance with an embodiment of the present invention. FIG. 4*a* shows the electronic component before the pinouts of the ICs underneath PCB 400 are configured to match the pinouts of the ICs on top of PCB 400. Four ICs, 401, 402, 403, and 404 are connected to PCB 400. IC 401 includes IO ports A1, A2, . . . A(n−1), and A(n). IC 402 includes IO ports B1, B2, . . . B(n−1), and B(n). IC 403 includes IO ports C1, C2, . . . C(n−1), and C(n). IC 404 includes IO ports D1, D2, . . . D(n−1), and D(n).

IO port A1 of IC 401 of FIG. 4*a* is to be connected to IO ports B1, C1, and D1 for proper communication of the first bit position of a shared bus between the ICs. IO port A2 of IC 401 is to be connected to IO ports B2, C2, and D2 for proper communication of the second bit position of the shared bus between the ICs. Other corresponding IO ports are to be similarly connected for proper communication of the associated bit positions of the shared bus between the ICs. For example, IO port A(n−1) is to be connected to IO ports B(n−1), C(n−1), and D(n−1), and IO port A(n) is to be connected to IO ports B(n), C(n), and D(n). The interconnects that would be necessary to connect corresponding IO ports of ICs 401–404 are shown in FIG. 4*b* for purposes of contrasting this interconnection scheme with the interconnection scheme of FIG. 4*b* (in which the ICs are properly configured). Note that the interconnect lines are cross-connected (potentially requiring extensive routing on the PCB) and that the interconnect lines are differing lengths depending on the associated bit position of the shared bus (potentially causing skew problems).

FIG. 4*b* shows the electronic component of FIG. 4*a* after the pinouts of the ICs underneath PCB 400, ICs 403 and 404, are configured to match the pinouts of the ICs on top of PCB 400, ICs 401 and 402. The pinout of each IC is configured so that IO ports that are connected to each other on opposite sides of the PCB are vertically aligned, and adjacent IO ports communicate the same bit positions of a shared bus. In this manner, interconnect 410, and other parallel interconnects through PCB 400 that connect the IO ports of one IC to another, can be made short and direct.

In accordance with one embodiment of the present invention, ICs having selective pinout configurations are placed side-by-side on a PCB and are configured to have identical bus pinouts. This allows each IO parallel bus port of an IC to be connected to a corresponding IO parallel bus port of another IC by interconnects of identical length. For example, note that interconnect 411 of FIG. 4*b* is the same length as other parallel interconnects in PCB 400, each interconnect coupling two IO ports of vertically aligned ICs to two IO ports of other vertically aligned ICs. The signals communicated across each interconnect will experience similar signal degradation and time delay because each interconnect is nearly identical. A system designer may find this interconnect scheme advantageous because the designer can simulate and optimize the interconnect route once for one interconnect of the bus, and use the same optimization for all other interconnects in the bus.

This invention has been described with reference to specific exemplary embodiments thereof. It will, however, be evident to persons having the benefit of this disclosure that various modifications and changes may be made to these embodiments without departing from the broader spirit and scope of the invention. The specification and drawings are, accordingly, to be regarded in an illustrative rather than a restrictive sense.

What is claimed is:

1. An integrated circuit comprising:
   a first input/output (IO) port to communicate a first signal in a first configuration and a second signal in a second configuration, the first and second signals being parallel signals of a bus;
   a first multiplexer coupled to the first IO port;
   a configuration IO port, the configuration IO port being an electrical connector disposed on a package of the integrated circuit; and
   a configuration signal line coupled between the first multiplexer and the configuration IO port to select between the first configuration and the second configuration.

2. The integrated circuit of claim 1, wherein the first IO port is connected to an input of the first multiplexer.

3. The integrated circuit of claim 1, wherein the first IO port is connected to an output of the first multiplexer.

4. The integrated circuit of claim 1, further comprising a second IO port to communicate the second signal in the first configuration and the first signal in the second configuration.

5. The integrated circuit of claim 4, further comprising a second multiplexer connected to the second IO port and to the configuration signal line.

6. A processor comprising:
   a parallel signal bus having a first signal line to communicate a predetermined first bit position of the bus and a second signal line to communicate a predetermined second bit position of the bus;
   a first input/output (IO) port selectively connected to the first signal line in a first configuration and to the second signal line in a second configuration;
   a second IO port selectively connected to the second signal line in the first configuration and to the first signal line in the second configuration; and
   a configuration IO port to select between the first configuration and the second configuration, the configuration IO port being an electrical connector disposed on a package of the processor.

7. The processor of claim 6, further comprising:
   a first multiplexer having an input connected to the first IO port, another input connected to the second IO port, and an output connected to the first signal line; and
   a second multiplexer having an input connected to the first IO port, another input connected to the second IO port, and an output connected to the second signal line.

8. The processor of claim 6, further comprising:
   a first multiplexer having an input connected to the first signal line, another input connected to the second signal line, and an output connected to the first IO port; and
   a second multiplexer having an input connected to the first signal line, another input connected to the second signal line, and an output connected to the second IO port.

9. The processor of claim 6, further comprising a configuration IO port to select between the first configuration and the second configuration.

10. An electronic component comprising:
    a printed circuit board (PCB);
    a power plane disposed in the PCB;

a ground plane disposed in the PCB;

a first integrated circuit (IC) connected to the PCB, the first IC having a first pinout configuration;

a first electrical interconnect connected to a configuration input/output port of the first IC at one end and to the power plane at another end to place the first IC in the first pinout configuration, the configuration input/output port of the first IC being an electrical connector disposed on a package of the IC;

a second IC connected to the PCB, the second IC being identical to the first IC and having a second pinout configuration that is a mirror image of at least a portion of the first pinout configuration; and a second electrical interconnect connected to a configuration input/output port of the second IC at one end and to the ground plane at another end to place the second IC in the second pinout configuration, the configuration input/output port of the second IC being an electrical connector disposed on a package of the IC.

11. The electronic component of claim 10, wherein the portion of the first pinout configuration is of a bus of the first and second ICs.

12. The electronic component of claim 10, wherein the first and second ICs are processors.

13. The electronic component of claim 10, wherein the first and second ICs are cache memory devices.

14. A method of coupling a bus in a first integrated circuit (IC) to a bus in a second IC that is identical to the first IC, the method comprising:

configuring the first IC to have a bus pinout in a first configuration using a first configuration input/output port of the first IC, the first configuration input/output port being an electrical connector disposed on a package of the first IC; and configuring the second IC to have a bus pinout in a second configuration that is inverted from the first configuration using a second configuration input/output port of the second IC, the second configuration input/output port being an electrical connector disposed on a package of the second IC.

15. The method of claim 14, further comprising the step of electrically coupling the bus in the first IC to the bus in the second IC.

16. The method of claim 14, wherein the step of configuring the first IC includes the step of electrically coupling the first configuration input/output port of the first IC to a power plane and the step of configuring the second IC includes the step of electrically coupling the second configuration input/output port of the second IC to a ground plane.

* * * * *